US008719762B2

(12) United States Patent
Chang et al.

(10) Patent No.: US 8,719,762 B2
(45) Date of Patent: May 6, 2014

(54) METHOD AND APPARATUS FOR TURNING CUSTOM PROTOTYPE BOARDS INTO CO-SIMULATION, CO-EMULATION SYSTEMS

(71) Applicant: Synopsys Taiwan Co., Ltd., Taipei (TW)

(72) Inventors: Yingtsai Chang, Fremont, CA (US); Sweyyan Shei, Cupertino, CA (US); Meng-Chyi Lin, Toufen Township (TW); Hwa Mao, Da-an District (TW); Ming Yang Wang, Lafayette, CA (US); Yuchin Hsu, Cupertino, CA (US)

(73) Assignee: Synopsys Taiwan Co., Ltd., Taipei (TW)

( * ) Notice: Subject to any disclaimer, the term of this patent is extended or adjusted under 35 U.S.C. 154(b) by 0 days.

(21) Appl. No.: 13/730,543

(22) Filed: Dec. 28, 2012

(65) Prior Publication Data

US 2013/0117007 A1 May 9, 2013

Related U.S. Application Data

(63) Continuation-in-part of application No. 13/597,997, filed on Aug. 29, 2012, and a continuation-in-part of application No. 13/025,809, filed on Feb. 11, 2011, now Pat. No. 8,281,280.

(60) Provisional application No. 61/561,045, filed on Nov. 17, 2011, provisional application No. 61/304,328, filed on Feb. 12, 2010, provisional application No. 61/582,194, filed on Dec. 30, 2011.

(51) Int. Cl.
*G06F 17/50* (2006.01)

(52) U.S. Cl.
USPC .............................................. 716/136

(58) Field of Classification Search
USPC ........................ 703/28; 716/106, 108, 136
See application file for complete search history.

(56) References Cited

U.S. PATENT DOCUMENTS

| 5,425,036 A | * | 6/1995 | Liu et al. ................ 714/735 |
| 5,457,408 A | | 10/1995 | Leung |
| 5,896,494 A | | 4/1999 | Perugini et al. |
| 5,991,897 A | | 11/1999 | Perugini et al. |

(Continued)

OTHER PUBLICATIONS

Non-Final Office Action for U.S. Appl. No. 13/025,809, mailed on Apr. 13, 2012; 8 pages.

(Continued)

*Primary Examiner* — Thuan Do
*Assistant Examiner* — Mohammed Alam
(74) *Attorney, Agent, or Firm* — Kilpatrick Townsend and Stockton LLP

(57) ABSTRACT

A custom prototyping board and a controller are integrated to form an emulation system for emulating a circuit design. The controller may be disposed on an adaptor board. The custom prototyping board is defined by a set of board description files which further define the FPGA device(s) used in the system as well as the wire connections among the FPGA devices and connectors on the custom prototyping board. The FPGA device(s) is configured in accordance with the partitioned circuit design. Each partitioned circuit in the FPGA device is associated with a verification module for communicating with the controller to control and probe the emulation. A host workstation may be used to link with the controller to support co-simulation or co-emulation of the circuit design.

6 Claims, 9 Drawing Sheets

(56) References Cited

U.S. PATENT DOCUMENTS

| | | |
|---|---|---|
| 6,002,868 A | 12/1999 | Jenkins et al. |
| 6,754,881 B2 | 6/2004 | Kuhlmann et al. |
| 6,842,729 B2 * | 1/2005 | Sample et al. .................. 703/24 |
| 7,353,162 B2 | 4/2008 | Huang et al. |
| 8,281,280 B2 | 10/2012 | Chang et al. |
| 2011/0202894 A1 * | 8/2011 | Chang et al. .................. 716/108 |
| 2013/0035925 A1 | 2/2013 | Chang et al. |
| 2013/0227509 A1 | 8/2013 | Chang et al. |

OTHER PUBLICATIONS

Notice of Allowance for U.S. Appl. No. 13/025,809, mailed on May 31, 2012, 8 pages.

Mao, H., "Prototyping the next-generation SoC verification platform", EDA & Development, Components in Electronics, Mar. 2011, 2 pages.

Non-Final Office Action for U.S. Appl. No. 13/597,997, mailed on Jun. 12, 2013, 8 pages.

* cited by examiner

METHOD AND APPARATUS FOR TURNING CUSTOM PROTOTYPE BOARDS INTO CO-SIMULATION, CO-EMULATION SYSTEMS

CROSS-REFERENCE TO RELATED APPLICATIONS

The present application is a continuation-in-part of U.S. application Ser. No. 13/597,997, entitled "Method and Apparatus for Versatile Controllability and Observability in Prototype System", filed on Aug. 29, 2012, which claims benefit under 35 USC 119(e) of U.S. Provisional Application No. 61/561,045 filed on Nov. 17, 2011. U.S. application Ser. No. 13/597,997 is a continuation-in-part of application Ser. No. 13/025,809, entitled "Method and Apparatus for Versatile Controllability and Observability in Prototype System", filed on Feb. 11, 2011, now U.S. Pat. No. 8,281,280, which claims benefit under 35 USC 119(e) of U.S. Provisional Application No. 61/304,328 filed on Feb. 12, 2010, the contents of all of which are incorporated herein by reference in their entirety.

The present application also claims benefit under 35 USC 119(e) of U.S. provisional Application No. 61/582,194, filed on Dec. 30, 2011, the content of which is incorporated herein by reference in its entirety.

BACKGROUND OF THE INVENTION

The present invention relates to integrated circuit design, and more particularly to integrating a custom prototyping board with one or more FPGA devices to form an emulation system.

FIG. 1 depicts a conventional system that can support co-simulation and co-emulation using FPGA devices. However, the FPGA device and boards are disposed in a closed vendor proprietary system. Therefore, users can not use or design their own FPGA-based prototyping boards in the system of FIG. 1.

System-on-chip (SoC) design verification requires both software and hardware to work together on a prototype board. A custom-built prototype board having integrated software and hardware provides a simple way to verify a design but due its lack of controllability and observability, it has a limited capability in isolating root causes of design defects.

What is needed is a design verification methodology capable of operating with a custom-made prototype board to verify a circuit design in a co-simulation or co-emulation mode.

BRIEF SUMMARY OF THE INVENTION

One embodiment in the present invention is to provide a method of integrating a custom prototyping board to make an emulation system for emulating a circuit design, including, in part: receiving a first custom prototyping board including at least one first FPGA and at least one connector, the board being described by a set of board description files; providing at least one adaptor board to connect to the first custom prototyping board through the at least one connector; partitioning the circuit design into the at least one first FPGA according to the set of board descriptions files for emulating the circuit design, wherein each verification module is generated according to the associated partitioned circuit design and the set of board descriptions files; and running emulation cycles comprising transmitting a plurality of input signal values from the controller, wherein each verification module receives a corresponding portion of the plurality of input signal values from the controller respectively, and the controller receives a plurality of output signal values transmitted from the verification modules.

In one embodiment, the input signal values transmitted from the controller is generated by a software component running on a workstation in a co-simulation mode, and the controller transmits a plurality of output signal values back to the software component by combining output signal values transmitted from each verification module into the plurality of output signal values.

In another embodiment, the input signal values transmitted from the controller are fetched from a memory device on the at least one adaptor board; and the controller saves a plurality of output signal values in the memory device by combining output signal values transmitted from each verification module into the plurality of output signal values.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

Figure 2:
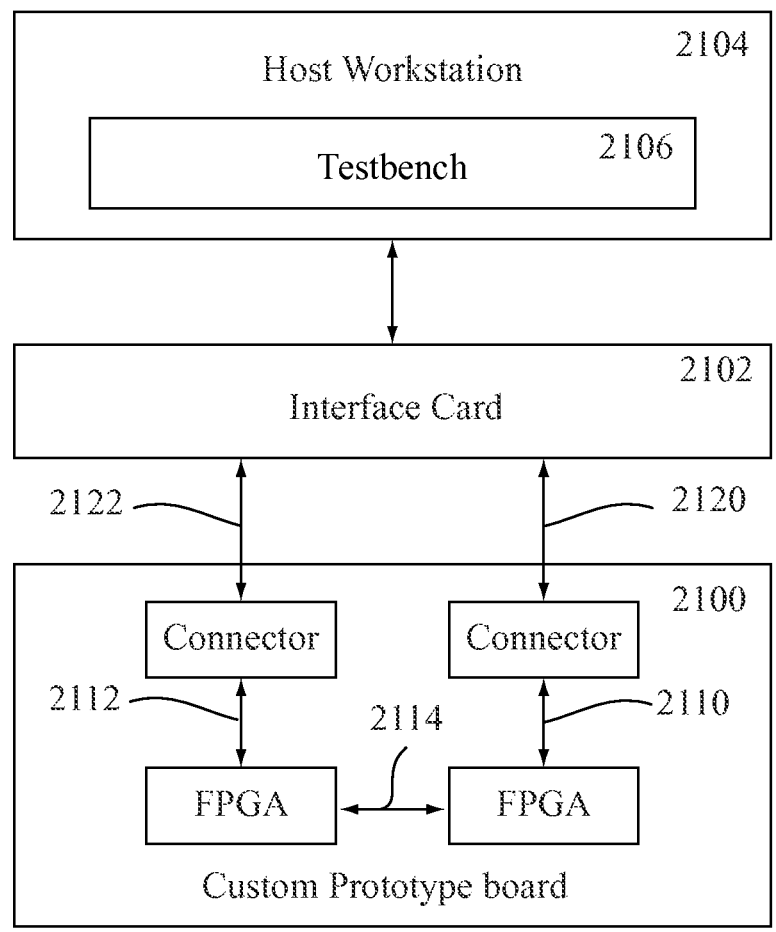
FIG. 2 is a schematic diagram of a system integrating a custom prototyping board adapted to run co-simulation and co-emulation, in accordance with one embodiment of the present invention.

FIG. 2 is a schematic diagram of a system integrating a custom prototyping board adapted to run co-simulation and co-emulation, in accordance with one embodiment of the present invention, as is also described with reference to FIG.

1 of U.S. application Ser. No. 13/025,809, now U.S. Pat. No. 8,281,280. The system of FIG. 2 is shown as including a testbench 2106 running on a host workstation 2104, a custom prototype board 2100, and an interface card 2102 adapted to connect the testbench 2106 to custom prototype board 2100. The custom prototype board 2100 is shown as including 2 FPGA devices and 2 connectors that are in communication with the interface card 2102 through cables 2120 and 2122. In order to describe the custom prototype board, a set of board description files are provided that describe, among other things, the FPGA device types, the wire connections 2114 connecting the FPGA devices, as well as wire connections connecting the pins of the FPGA devices to the pins of the connectors 2110 and 2112. Accordingly, after the board description files are set up, the footprint of the board and the type of components on the board are known.

Figure 3:
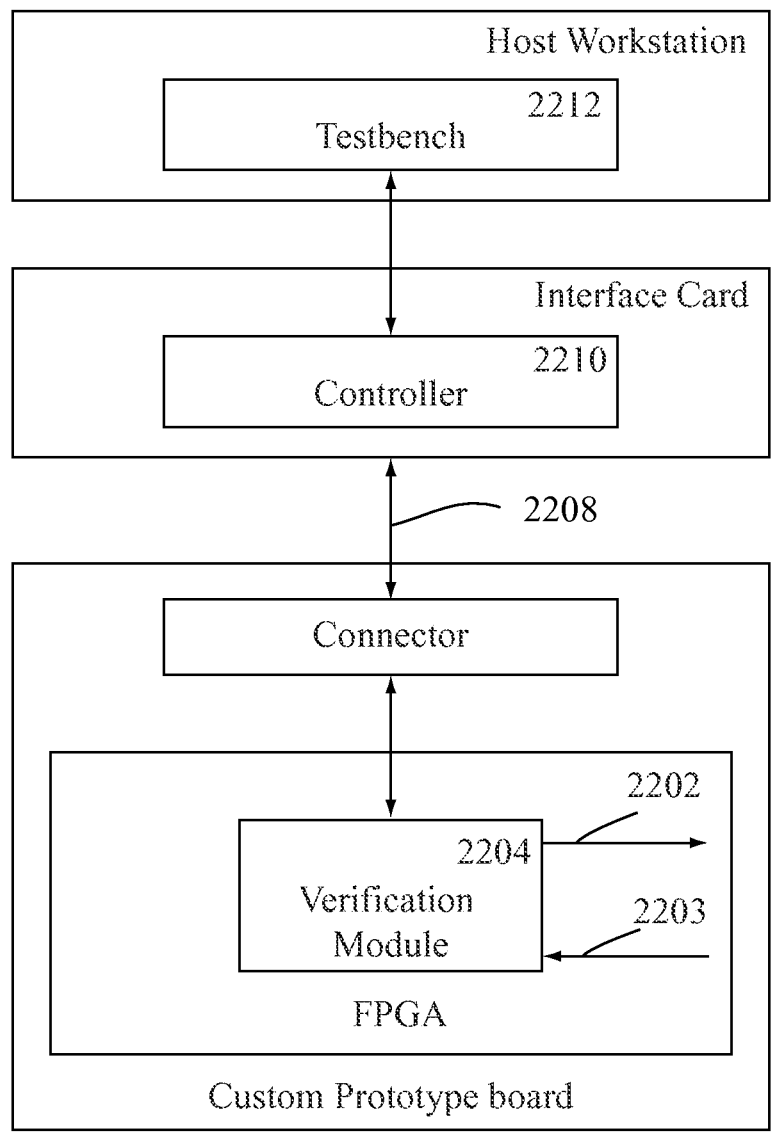
FIG. 3 shows the data paths between primary input signals, primary output signals and the testbench running on a host workstation of FIG. 2, in accordance with one embodiment of the present invention.

FIG. 3 shows the data paths between primary input signals 2202, primary output signals 2203, and testbench 2212 running on a host workstation. In one embodiment, values for primary input signals 2202 originating from testbench 2212 are communicated to a controller 2210 disposed on an interface card. The controller 2210 communicates these signals to the verification module 2204 in the FPGA(s) disposed on user's custom prototype board. Verification Module 2204 then communicates the primary input signals to the part of the user design on the same FPGA. Primary output signals 2203 follow an opposite path. Verification Module 2204 collects the primary output signals from the part of a user design on the same FPGA, and communicates them to the controller 2210 on the interface card. The controller 2210 on the interface card then communicates those signals to the testbench 2212.

During co-simulation, primary input signals are communicated to the user design within the FPGA devices. Then, a clock edge is communicated to the prototype board, which may update the states of certain register elements and memory elements in the FPGA devices. After that, primary output signals are communicated to the testbench running on the host workstation. These steps are repeated for each active clock edge until the co-simulation is completed.

The board description files are referenced when verification modules are created at the setup time. In FIG. 3, primary input signals 2202 and primary output signals 2203 are connected to associated verification modules 2204. The verification modules are configured in accordance with the board description files such that primary input and output signals are routed properly to the connector pins that are connected to interface card through cables 2208. FIG. 3 shows only one FPGA in communication with the controller however it is understood that any number of FPGAs may be used. In one embodiment in accordance with the present invention, the configuration shown in FIG. 3 is duplicated for each FPGA on the custom prototype board. Therefore, the controller 2210 first receives the primary input signals from host workstation. The controller then communicates the portions associated with each verification module 2204 on each FPGA concurrently to reduce the time needed to distribute the primary input signals to the user design in FPGA devices, thereby improving the co-simulation speed. Likewise, the controller 2210 receives the primary output signals concurrently from each verification module 2204 on each FPGA. It then combines the received output signals to form a complete set which it subsequently delivers to the host workstation in one batch. The parallelism for transmitting primary input and output signals between multiple FPGA devices and the controller speeds up the co-simulation.

Moreover, advantageously since the controller is separate from the custom prototype board competition with the user design for valuable FPGA resources on the prototype board is eliminated. Furthermore, the controller may play different roles in different operating modes, such as prototyping, co-simulation, and the like.

Co-simulation Clocks

During co-simulation, clock edges that can cause state changes for some register elements or memory elements in the user design are communicated from the testbench via the controller to FPGA devices on the custom prototype board. Although there are multiple FPGA devices on the custom prototype board, the controller may only deliver the clocks to one FPGA chip. The receiving FPGA chip may buffer the received clock signals, and then distribute them evenly to all FPGA devices via on-board clock tree circuitries.

Figure 4:
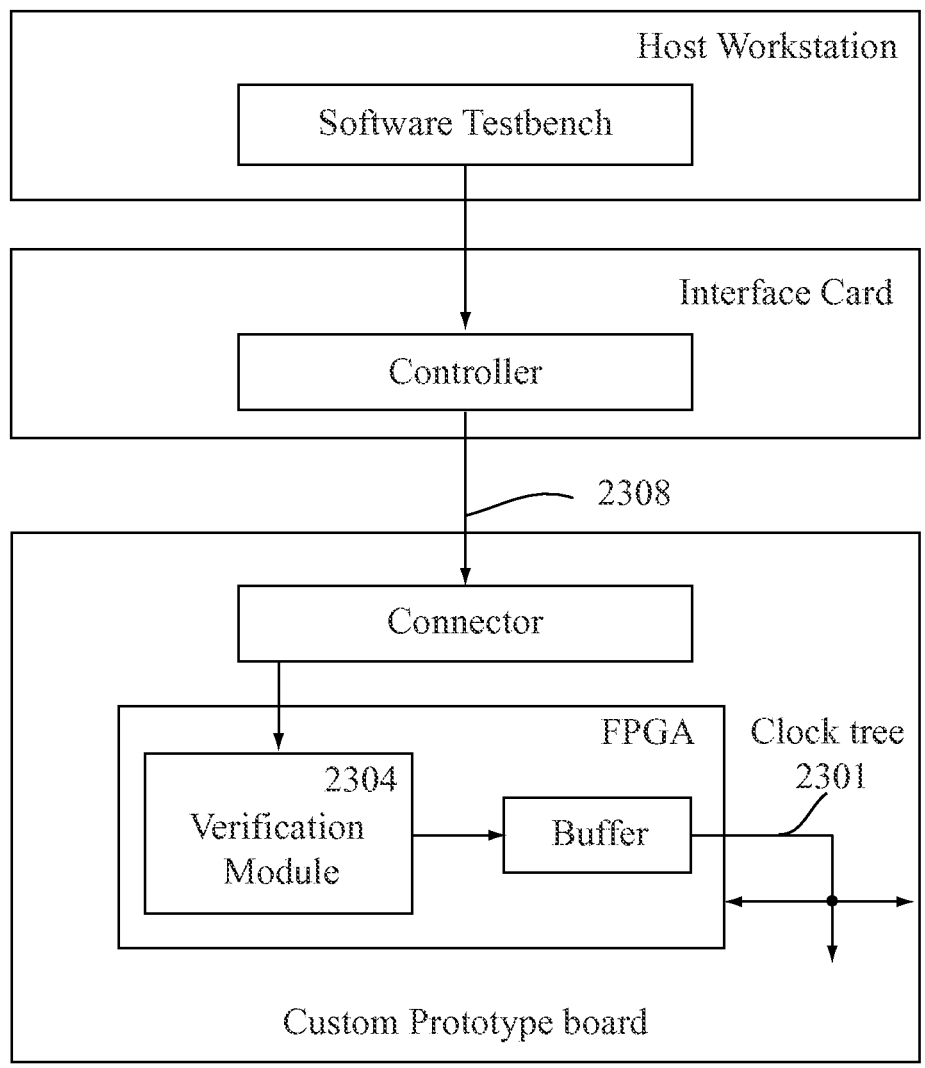
FIG. 4 is a schematic diagram of a system integrating a custom prototyping board adapted to run co-simulation and co-emulation and deliver a clock signal from a testbench to an on-board clock tree, in accordance with one embodiment of the present invention.

FIG. 4 is a schematic diagram of a system integrating a custom prototyping board adapted to run co-simulation and co-emulation and deliver a clock signal from a testbench to an on-board clock tree via the controller and the corresponding verification module, in accordance with one embodiment of the present invention. From the board description files, setup software can recognize the on-board clock tree 2301, and generate the verification module 2304 accordingly.

Co-simulation Setup

Figure 8:
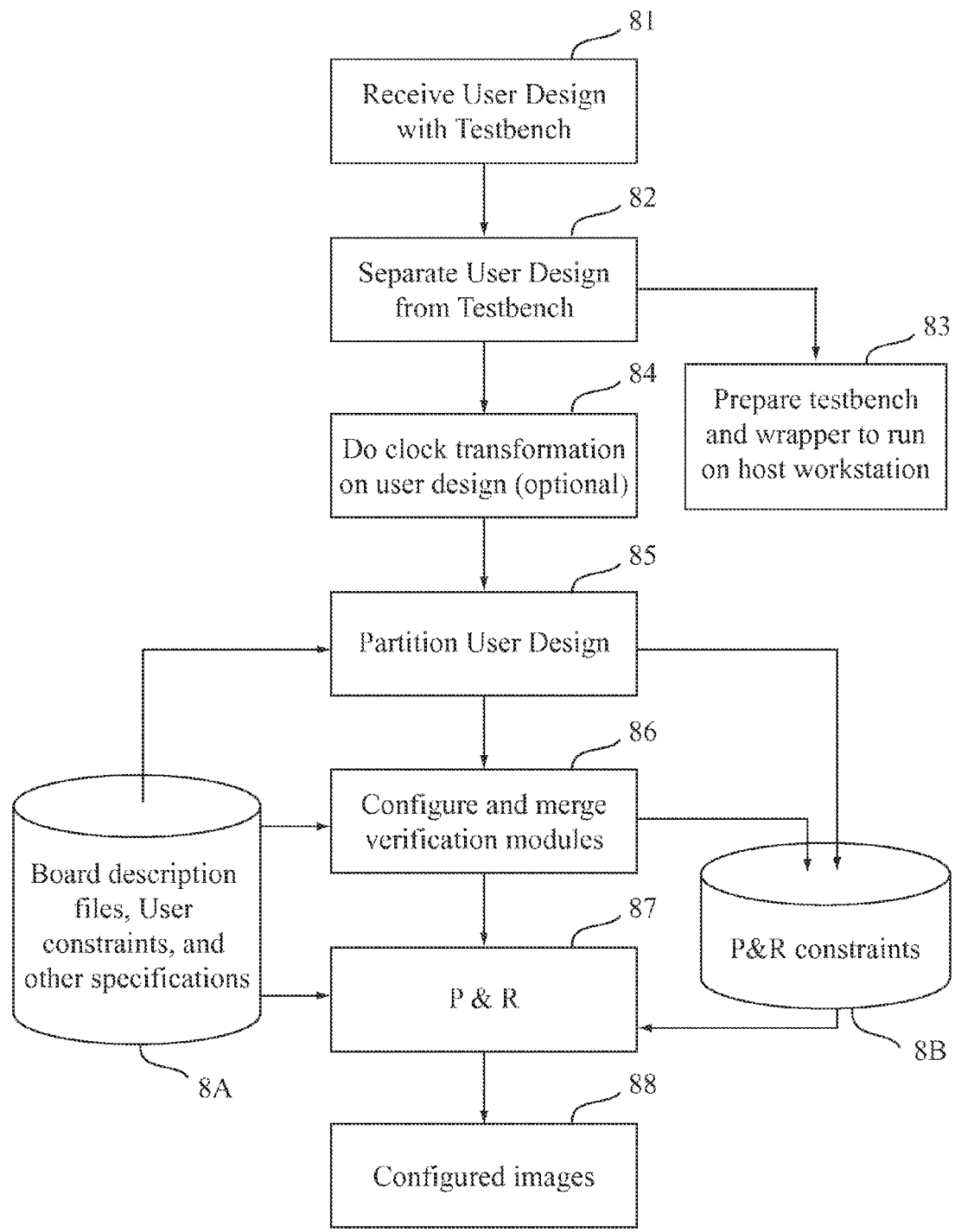
FIG. 8 is an exemplary flowchart for preparing software program and FPGA configuration files for co-simulation, in accordance with one embodiment of the present invention.

FIG. 8 is an exemplary flowchart for preparing the software program to run on the workstation and configuration images to configure FPGA(s) for co-simulation, in accordance with one embodiment of the present invention. A user design along with its testbench is received at 81. The testbench is then separated from the user design at 82. The separated testbench and a wrapper are run on a host workstation at 83. The wrapper running on the host workstation collects and delivers primary input and output signals between the testbench and the user design via the controller and the associated verification modules. The wrapper also delivers clock edges to the user design in between each sampling and delivery of primary input and output signals.

The separated user design then optionally transforms clock signals to address hold time anomalies in the user design at 84. At 85, the user design is partitioned in accordance with the board description files so that each partitioned portion of the user design can fit in a specific FPGA on the custom prototype board. At 86, verification modules specific to each partitioned portion of user design are generated and configured in accordance with the board description files 8A. Verification modules may receive and communicate primary input signals from the controller to the associated portions of the user design, and may also collect and communicate primary output signals from the associated portions of the user design to the controller. The verification modules route primary input and output signals to appropriate connector pins in accordance with the board description files.

Place and route (P&R) is then performed on the partitioned portions of the user design along with generated verification modules at 87. Place and route may be performed in accordance with the constraints 8A generated at partition time and verification module generation time. At 88, the result of P&R is a downloadable image which can be used to configure an FPGA device on the custom prototype board. The configured images are ready to download prior to co-simulation runs.

Vector Mode

FIG. 3 shows the data paths for primary input and output signals during co-simulation with a testbench running on the host workstation in one embodiment. In one example, the primary input signal values may be pre-generated on a cycle-by-cycle basis. For example, the cycle-by-cycle input signal values may be saved from previous co-simulation runs or software-based simulation runs, or they may come from existing golden sets. Alternatively, a separate program may be written to create the cycle-by-cycle values for the primary input signals.

Figure 5:
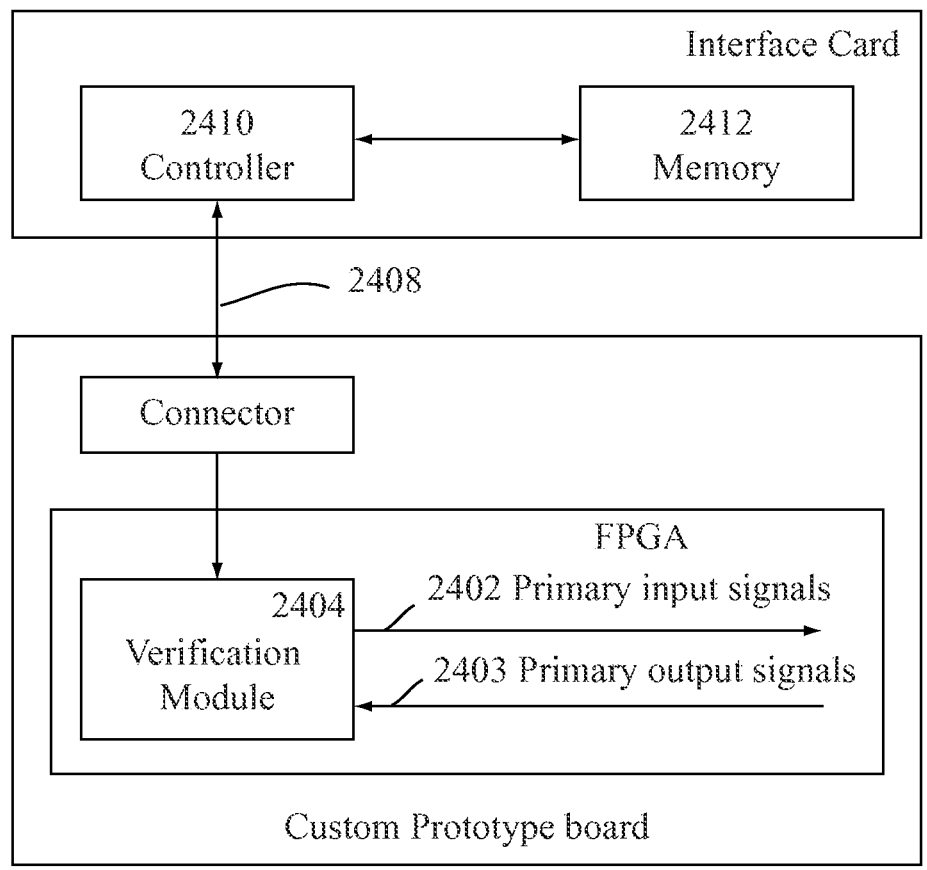
FIG. 5 shows an example of pre-generated input vectors stored in a memory disposed on the interface card, as shown in FIGS. 2 and 4, in accordance with one embodiment of the present invention.

As shown in FIG. 5, the pre-generated, cycle-by-cycle, primary input signal values, which may be called "input vectors", may be downloaded and kept in memory 2412 on the interface card in one embodiment. Then, controller 2410 can fetch the input vectors from memory 2412 and communicate the input vectors to verification modules one vector at a time in the same way as in regular co-simulation in which the controller receives primary input signal values from testbench running on the host workstation. Clock signals may be "tagged" to the input vectors so that they can tell the controller which clock edge is to apply after the current vector is delivered to the primary input signals 2402 of the user design.

When running in the vector mode, several options for handling the primary output signal values 2403 exist. The first option is to discard the signal values and rely on signal probing for debugging purposes or the behavior of target boards to determine if the emulation is successful, as described further below. The second option is to store the primary output signal values 2403 in memory 2412 disposed on the interface card using controller 2410. The stored values may be uploaded to the host workstation at the end of vector mode emulation. The third option is to generate a "signature" from the collected primary output signal values, and report the signature to the host workstation at the end of co-simulation. The waveform signature generation may be done in the controller or in the associated verification modules.

Co-simulation speed can be limited by the "ping-pong" nature of exchanging primary input and output values between user design in FPGA devices and testbench running on the host workstation on each and every clock edge. It typically runs in thousands of cycles per second or less. In contrast, vector mode can run at, for example, millions of cycles per second. At such speeds, it is possible to use the prototyping board to drive target boards or systems close to real time, thus enabling the user to rely on the behavior of the target boards/systems to determine if the design is working correctly. Hence, the primary output values may be discarded during the vector mode emulation.

At millions of cycles per second running in vector mode, the user can also use the same probing technique used in prototyping systems for debugging purposes. To accomplish this, only a portion of memory 2412 on the interface card is used to store input vectors. The rest is reserved for storing probed signal values at runtime. The trigger mechanism supported by controller 2410 for prototyping systems is equally applicable in vector mode. The saved probe signal values can be uploaded to the host workstation at the end of emulation for further analysis.

Vector Mode Setup

Except for a few differences, vector mode setup is similar to the co-simulation mode setup. One such difference is that there is no testbench that needs to run on the host workstation side. The user can start with the setup flow for co-simulation, run co-simulation, save input vectors and clock edges cycle-by-cycle in a file, and then turn to vector mode using the saved input vectors and clock edges.

SCEMI

SCEMI, which stands for Standard Co-Emulation Modeling Interface, is proposed by the Accellera standards organization. SCEMI 2.0 was released in 2007.

SCEMI is a convention for message passing between software components running on the host workstation and hardware transactors that wrap the user design on the emulation hardware. It raises the communication from signal level to transaction level between the host workstation and the emulator hardware, thereby improving the co-simulation speed.

Figure 6:
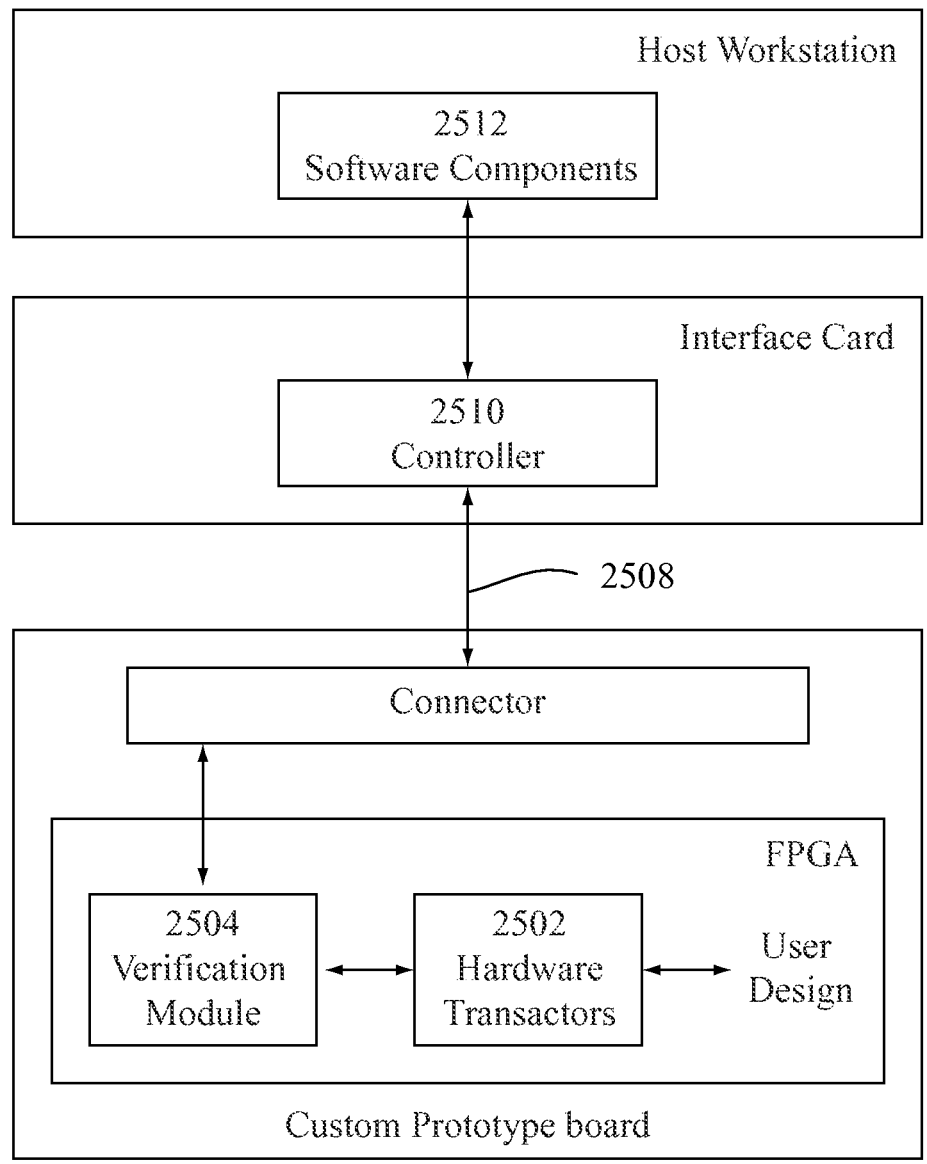
FIG. 6 is a schematic diagram of a system integrating a custom prototyping board adapted to run co-simulation and co-emulation with the custom prototyping board running in the SCEMI mode, in accordance with one embodiment of the present invention.

FIG. 6 shows an example of running SCEMI on a custom prototyping board. Software components 2512 run on the Host Workstation side in one embodiment. They exchange messages with hardware transactors 2502 that wrap the user design in FPGA. Messages travel through the controller 2510, cable 2508, connector and verification module 2504. Messages may be sent from software components to hardware transactors, or they may be sent from hardware transactors to software components. When sending a message, clocks on the custom prototype board may be suspended, and may be resumed after the message has been sent. The user design and the hardware transactors run on clocks generated on the custom prototype board. Therefore, when clocks are not suspended, the FPGA devices on the custom prototype board are running on clocks generated by the prototype board, which typically range in millions of cycles per second.

The probing scheme, described above for vector mode, which utilizes the memory and the controller on the interface card may be used in the SCEMI mode.

SCEMI Setup

As in case for co-simulation, during the setup for SCEMI based co-emulation, custom board description files are consulted, and the verification modules are generated accordingly. The infrastructure implemented in the controller and the generated verification modules enable the message exchange scheme at SCEMI runtime.

Transactors and associated verification modules work in tandem. When a transactor wants to send or receive a message, it may want to suspend clocks in coordination with the associated verification module. Since clocks in SCEMI are typically generated on a FPGA and evenly distribute to all FPGA devices via the on-board clock trees, when the verification module needs to suspend clocks on behalf of a transactor, it may need to propagate the request to the FPGA responsible for clock generation. During setup, the board description files are consulted so that appropriate signal lines are designated for this purpose.

Target Board Running at, or Close to, Full Speed

Figure 1:
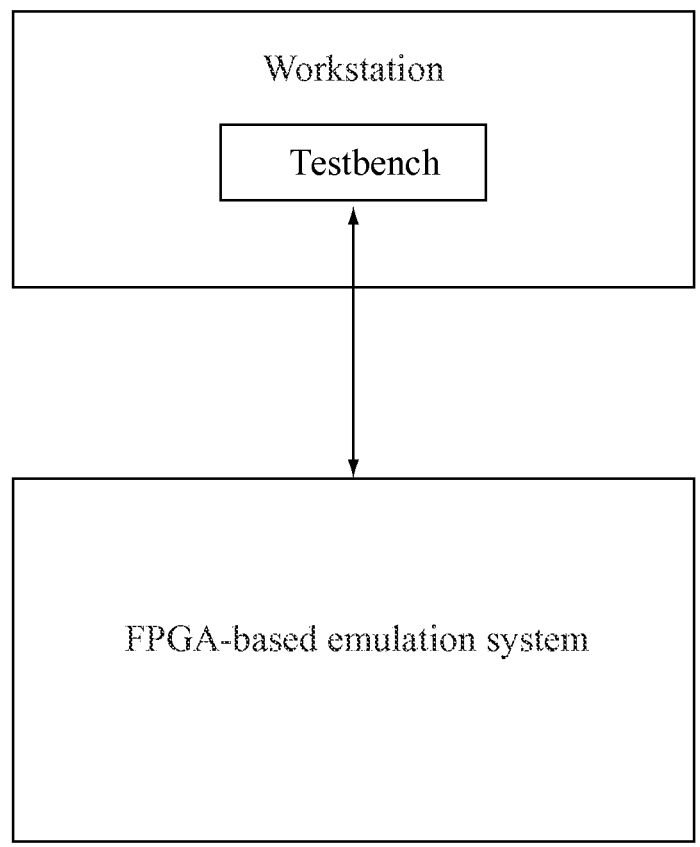
FIG. 1 depicts a system adapted to support co-simulation and co-emulation using FPGA devices, as known in the prior art.

In conventional systems, the speed of any extension components or target boards that a user may plug in is limited by the emulation system vendor's board design. Such a speed limitation is especially severe when running co-simulation or co-emulation on closed systems, such as the one shown in FIG. 1, with target extensions. In accordance with the embodiments of the present invention, these speed limitations are overcome. Since, in accordance with embodiments of the present invention users have complete freedom in designing their own FPGA boards and target interfaces, the custom designed target interfaces and FPGA boards can continue to run at, or close to, prototyping speed while running in vector mode or SCEMI mode.

Figure 7:
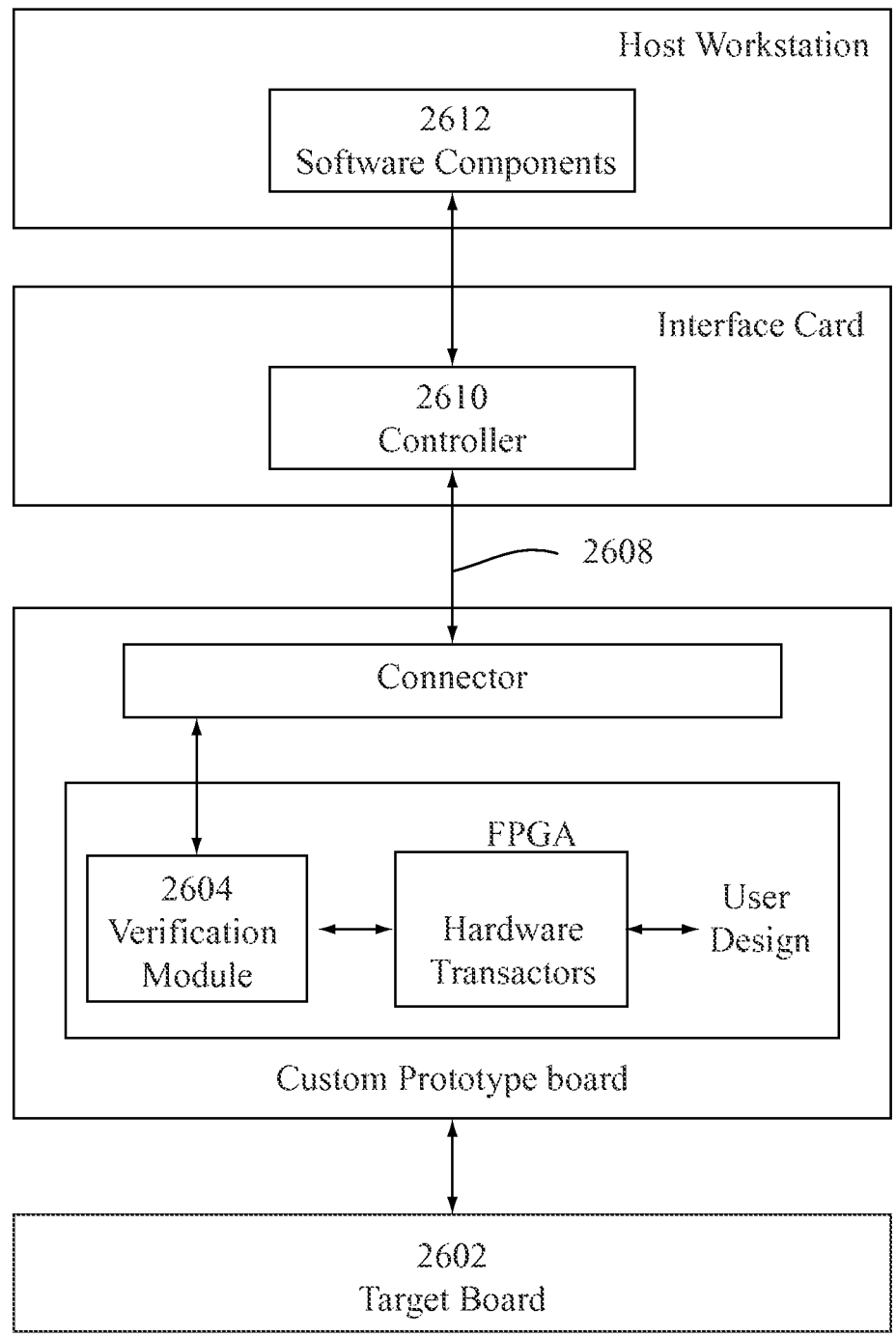
FIG. 7 is a schematic diagram of a system integrating a custom prototyping board adapted to run co-simulation and co-emulation with target board running in the SCEMI mode, in accordance with one embodiment of the present invention.

FIG. 7 is a schematic diagram of a system integrating a custom prototyping board adapted to run co-simulation and co-emulation with target board running in the SCEMI mode, in accordance with one embodiment of the present invention. Target Board 2602 is connected to the custom prototype board via custom designed target interfaces. For prototyping, the target board can achieve the speed that the user demands. The same speed can be maintained in the SCEMI mode as long as the clocks are not suspended during message passing. This unique flexibility can only be achieved on an "open" system in which users have freedom in designing their own prototyping boards and target interfaces.

In FIG. 7, Target Board 2602 is shown as being separate from the custom prototyping board. Although not shown, in other embodiments, the target may be a separate component mounted on the custom prototyping board. Since the users have complete freedom in designing their own custom prototyping board, they can choose to put the target on a separate board, or to mount it along with FPGA devices on the same prototyping board.

Although FIG. 7 illustrates the flexibility in the SCEMI mode, the same can be achieved in the vector mode. As described above, the vector mode can run at a relatively very high speed. Thus, the target board speed may be sustainable in the vector mode.

Figure 9:
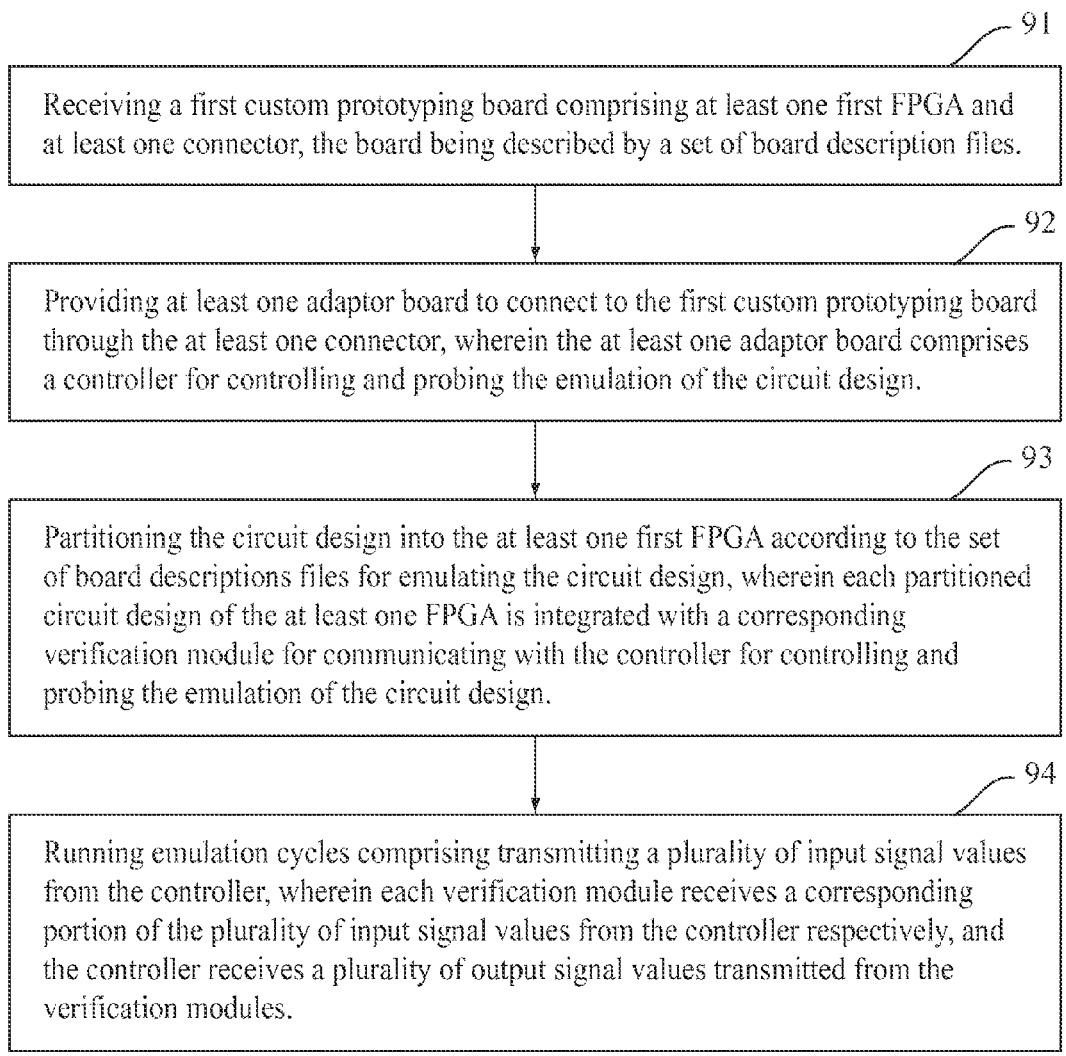
FIG. 9 is an exemplary flowchart for integrating a custom prototyping board into an emulation system for emulating a circuit design, in accordance with one embodiment of the present invention.

A method of debugging a customer prototype board using emulation may be performed as described above with reference to FIG. 2 to FIG. 8. FIG. 9 shows a flowchart for integrating a custom prototyping board to make an emulation system for emulating a circuit design. At 91, a first custom prototyping board that included FPGA devices and described by a multitude of board description files is received. The board description files describe the components and the connections among the components on the first custom prototyping board. For example, if there are three FPGA devices and one connector on the board, the board description files will contain the type of each FPGA and the wire connections among the FPGA devices as well as the wire connections from the pins of the FPGA devices to the pins of the connector. After the board description files are obtained, the footprint of the board and the type of components are known. At 92, at least one adaptor board is provided to electrically couple to the first custom prototype board through connectors. At 93, user's circuit design is partitioned into the FPGA devices according to the board descriptions files for emulating the circuit design. Each partitioned circuit design of the at least one FPGA is integrated with a corresponding verification module for communicating with the controller and for controlling and probing the emulation of the circuit design. Each verification module is generated according to the associated partitioned circuit design and the set of board descriptions files. After the FPGA devices are configured, emulation cycles can be run to emulate and debug the circuit design, as shown at 94. There are different ways to generate test patterns for the FPGA devices on the customer prototyping board. For example, test patterns may be delivered from a test-bench running on a workstation, or they me be fetched from a local memory. Either way, the controller transmits a multitude of input signal values to the verification modules associated with the FPGA devices. Each verification module receives a corresponding portion of the multitude of input signal values from the controller respectively, and passes the received signal values to its associated partitioned circuit in a FPGA device. After an emulation cycle is run, the controller receives a multitude of output signal values from the verification modules. The output signal values transmitted by the verification modules are generated by the partitioned circuits associated with the verification modules in response to the received portions of the multitude of input signal values passed to the partitioned circuits via the verification modules.

In one embodiment, the input signal values transmitted from the controller are generated by a software component running on a workstation in a co-simulation mode. In one embodiment, the controller transmits a multitude of output signal values, generated by combining the output signal values transmitted from each verification module, back to the software component.

In another embodiment, the input signal values transmitted from the controller are fetched from a memory device on at least one adaptor board. The controller saves the output signal values transmitted by each verification module in the memory device.

In one embodiment, at least one transactor is integrated with at least one verification module and the corresponding portioned circuit design for co-emulating the circuit design. In one embodiment the transactor and a software component running on a workstation exchange messages. In one embodiment at least one first portion of the partitioned circuit design is clocked by at a first clock which is suspended during message passing (transfer) between the transactor and the software component, and reactivated after the message passing is completed.

In another embodiment, a target component is coupled to the partitioned circuit design. The target component, the transactor and a portion of the partitioned circuit design are clocked by a second clock which is not suspended during message passing between the transactor and the software component running on the workstation.

The above embodiments of the present invention are illustrative and not limitative. Other additions, subtractions or modifications are obvious in view of the present disclosure and are intended to fall within the scope of the appended claims.

What is claimed is:

1. An apparatus adapted to emulate a circuit design, the apparatus comprising:
 a first board comprising:
  at least one FPGA; and
  at least one connector, the first board being defined by at least one or more description files; and
 a second board adapted to be connected to the first board via the at least one connector, the second board comprising a controller adapted to control the emulation, the at least one FPGA configured to receive a partition of the circuit design in accordance with the description files when the apparatus is invoked to emulate the circuit design, each partition being associated with a verification module adapted to communicate with the controller, each verification module adapted to be generated in accordance with the partition and the description files, said controller being further adapted to:
  run a plurality of emulation cycles;
  transmit a plurality of input signals to the verification modules; and
  receive a plurality of output signals from the verification modules, the output signals being generated by the partition in response to at least a subset of the plurality of input signals.

2. The apparatus of claim 1 wherein the plurality of input signals is generated by a software component running on a workstation in a co-simulation mode when the workstation is invoked to run the software component, wherein the controller is further adapted to transmit the plurality of output signals to the software component, and wherein the emulation cycles are controlled by clocks generated by the software component.

3. The apparatus of claim 1 further comprising:
 a memory disposed on the second board and storing the plurality of input signal values, wherein said controller is further adapted to generate plurality of clock signals controlling the plurality of emulation cycles.

4. The apparatus of claim 3 wherein the controller is adapted to:
 combine the plurality of output signal values to form and save the plurality of output signal values in the memory.

5. The apparatus of claim 2 further comprising:
a transactor integrated with at least one verification module and the least one verification module's associated partition, wherein the transactor and the software component exchange messages, wherein at least a first portion of the partition is clocked by at least a first clock generated by the at least one FPGA, wherein the at least first clock is suspended during message transfer between the transactor and the software component, and wherein the at least first clock is reactivated after the message transfer is completed.

6. The apparatus of claim 5 further comprising:
a target component coupled to the partitioned circuit design, wherein the target component, the transactor and at least a second portion of the partition are clocked by at least a second clock generated either by the at least one FPGA or the target component, wherein the at least second clock is not suspended during message transfer between the transactor and the software component.

* * * * *